(12) United States Patent
Mullins

(10) Patent No.: US 7,569,802 B1
(45) Date of Patent: Aug. 4, 2009

(54) PHOTOSENSOR CONTROL UNIT FOR A LIGHTING MODULE

(76) Inventor: Patrick Mullins, 1703 E. O St., Apt. E, Russellville, AR (US) 72801

(*) Notice: Subject to any disclaimer, the term of this patent is extended or adjusted under 35 U.S.C. 154(b) by 204 days.

(21) Appl. No.: 11/435,020

(22) Filed: May 15, 2006

Related U.S. Application Data

(63) Continuation-in-part of application No. 10/822,537, filed on Apr. 12, 2004, now abandoned.

(60) Provisional application No. 60/456,111, filed on Mar. 20, 2003.

(51) Int. Cl.
*G01J 1/32* (2006.01)
*H05B 37/02* (2006.01)
(52) U.S. Cl. .................. 250/205; 250/214 AL
(58) Field of Classification Search ............... 250/205, 250/214 AL, 214 B
See application file for complete search history.

(56) References Cited

U.S. PATENT DOCUMENTS

| | | | |
|---|---|---|---|
| 3,925,244 A * | 12/1975 | Nagasawa et al. | 250/372 |
| 3,949,211 A | 4/1976 | Elms | |
| 3,961,180 A | 6/1976 | Schultz | |
| 4,095,100 A | 6/1978 | Selick | |
| 4,330,706 A | 5/1982 | Lawenhaupt | |
| 4,347,461 A | 8/1982 | Carlson | |
| 5,195,016 A | 3/1993 | Powers | |
| 5,325,023 A | 6/1994 | Martich | |
| 5,404,080 A | 4/1995 | Quazi | |
| 5,894,175 A | 4/1999 | Berlin et al. | |
| 5,895,986 A | 4/1999 | Walters et al. | |
| 6,447,150 B1 * | 9/2002 | Jen et al. | 362/403 |
| 6,452,340 B1 | 9/2002 | Morrissey, Jr. et al. | |
| 6,495,964 B1 | 12/2002 | Muthu et al. | |
| 6,614,013 B2 | 9/2003 | Pitigoi-Aron et al. | |
| 6,617,560 B2 | 9/2003 | Forke | |
| 6,642,955 B1 * | 11/2003 | Midgley et al. | 348/164 |
| 7,188,984 B2 * | 3/2007 | Sayers et al. | 362/545 |
| 2002/0003214 A1 | 1/2002 | Morrissey Jr. et al. | |
| 2002/0159274 A1 | 10/2002 | Hubbell et al. | |
| 2002/0163805 A1 | 11/2002 | Hubbell et al. | |
| 2003/0117803 A1 | 6/2003 | Chen | |

* cited by examiner

*Primary Examiner*—Thanh X Luu
(74) *Attorney, Agent, or Firm*—Mind Law Firm; Jerome V. Sartain

(57) ABSTRACT

A photosensor control unit for use in a lighting module has a light sensor and a switch adapted to operably control a light source such as a plurality of LEDs responsive to the light sensor. The light source is adapted to be mounted in the lighting module, and is configured to produce light having wavelengths within a first range of wavelengths. The light sensor is adapted to be mounted on or about the lighting module, and is responsive to light having wavelengths within a second range of wavelengths. The second range of wavelengths is exclusive of the first range of wavelengths. The switch is adapted to operably control the light source responsive to the light sensor such that the light source emits light having wavelengths within the first range of wavelengths responsive to the presence or absence of light within the second range of wavelengths.

2 Claims, 4 Drawing Sheets

PHOTOSENSOR CONTROL UNIT FOR A LIGHTING MODULE

RELATED APPLICATIONS

This is a continuation-in-part application of a prior filed application having Ser. No. 10/822,537 and a filing date of Apr. 12, 2004 now abandoned.

This application for a utility patent claims the benefit of U.S. Provisional Application No. 60/456,111, filed Mar. 20, 2003, and U.S. Utility application Ser. No. 10/805,969, filed Mar. 22, 2004. These applications are incorporated herein by reference in their entirety.

INCORPORATION BY REFERENCE

Applicant hereby incorporates herein by reference any and all U.S. patents and U.S. patent applications cited or referred to in this application.

BACKGROUND OF THE INVENTION

1. Field of the Invention

This invention relates generally to photosensor control units, and more particularly to a photosensor control unit adapted to be used with an outdoor lighting system wherein a light sensor is positioned within the lighting system adjacent a plurality of LEDs or the like of the lighting system.

2. Description of Related Art

Outdoor lighting systems are commonly used to illuminate selected areas at night. Light sources of outdoor lighting systems are typically turned on in response to low ambient light conditions (e.g., after sunset) and turned off during high ambient light conditions (e.g., during daylight hours). Many outdoor lighting systems with automatic on-off control systems responsive to ambient light conditions include photoconductive cells (i.e., photocells).

Known outdoor lighting fixtures with automatic on-off control include photocells sensitive to visible light. Such photocells cannot distinguish between ambient light and light produced by the lighting fixtures. In order to prevent the photocells from being influenced (e.g., triggered) by the light produced by the lighting fixtures, the photocells must be oriented (i.e., aimed) away from the light exiting the lighting fixtures. As a result, the photocells are often positioned in locations where they are subject to harmful conditions.

For example, known street lighting fixtures have photocontrols positioned on upper surfaces of housings. The photocontrols are subjected to direct sunlight all day long. Sunlight includes destructive ultraviolet radiation, and solar heating causes the components of the photo-controls to be heated to temperatures in excess of 85 degrees Celsius. In addition, the upper surface mounting of the photo-controls also subjects the photo-controls to harsh weather, debris from trees, and bird droppings. The debris from trees and bird droppings can obscure plastic windows through which light passes, shading internal photocells from the ambient light and causing the street lighting fixtures to operate for longer hours. These and other exposure conditions often eventually lead to failure or unpredictable performance of the photo-controls and/or the street lighting fixtures. Furthermore, top side socket mounted photo control units frequently leak water into the fixture, which can cause internal failures.

It would be advantageous to have a lighting assembly with automatic on-off control that does not include a photo-control positioned on an upper surface of the lighting assembly.

SUMMARY OF THE INVENTION

Aspects of the present invention teach certain benefits in construction and use which give rise to the objectives described below.

Aspects of the present invention provide a photosensor control unit for use in a lighting module. In an exemplary embodiment, the photosensor control unit includes a light sensor and a switch adapted to operably control a light source such as a plurality of LEDs responsive to the light sensor. The light source is adapted to be mounted in the lighting module, and is configured to produce light having wavelengths within a first range of wavelengths. The light sensor is adapted to be mounted on or about the lighting module, and is responsive to light having wavelengths within a second range of wavelengths. The second range of wavelengths is exclusive of the first range of wavelengths. The switch is adapted to operably control the light source responsive to the light sensor such that the light source emits light having wavelengths within the first range of wavelengths responsive to the presence or absence of light within the second range of wavelengths.

A primary objective of the present invention is to provide a photosensor control unit having advantages not taught by the prior art.

Another objective is to provide a photosensor control unit that includes a light sensor that can be mounted adjacent a plurality of LEDs or the like within a lighting module.

Another objective is to provide a photosensor control unit wherein a light source directs light in a first direction, and the light sensor of the photosensor control unit is directed to receive light from a second direction that is substantially opposite of the first direction.

A further objective is to provide a photosensor control unit for use in conjunction with a light source configured to produce light having wavelengths within a first range of wavelengths, while the light sensor is configured to detect light having wavelengths within a second range of wavelengths, whereby the light sensor is not misled by light emitted from the light source.

Other features and advantages of the present invention will become apparent from the following more detailed description, taken in conjunction with the accompanying drawings, which illustrate, by way of example, the principles of the invention.

BRIEF DESCRIPTION OF THE DRAWINGS

The accompanying drawings illustrate aspects of the present invention. In such drawings.

DETAILED DESCRIPTION OF THE INVENTION

Figure 1:
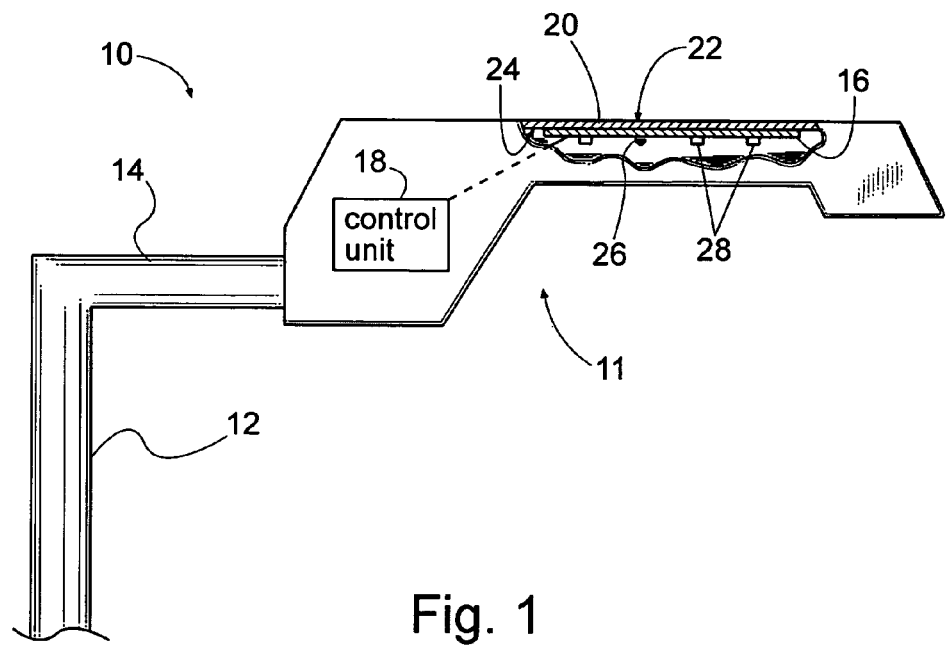
FIG. 1 is a side elevation view of one embodiment of a lighting module that includes a photosensor control unit, the lighting module being attached to a vertical light pole via a horizontally extending arm, wherein the lighting module includes a circuit board mounted within a housing.

FIG. 1 is a side elevation view of one embodiment of a lighting module 10 that includes a photosensor control unit 11. In this embodiment, the lighting module 10 is attached to a vertical light pole 12 via a horizontally extending arm 14, and includes a plurality of light-emitting diodes (LEDs) 28 within a protective housing 20. In this embodiment, the housing includes a top surface 22 and an inner surface 24 that extends to a perimeter 25. While LEDs 28 are referred to throughout as the exemplary light source employed in connection with the photosensor control unit 11 of the present invention, those skilled in the art will appreciate that numerous other light sources now known or later developed may be employed without departing from the spirit and scope of the invention. Moreover, as will be apparent from the following description, the photosensor control unit 11 is effectively a stand-alone unit capable of being configured for installation and use on or in conjunction with a lighting module 10 of virtually any kind irrespective of the light source to be controlled, such that the invention is not limited to and is independent of any particular kind of lighting module or light source. As such, it will be appreciated by those skilled in the art that the following discussion relating the installation and use of the photosensor control unit 11 to a particular lighting module 10, including a plurality of LEDs 28, is merely illustrative and that the invention is not so limited.

With continued reference to FIG. 1, the photosensor control unit 11 of the exemplary embodiment includes a control unit 18 operably connected to a light sensor 26 for operably controlling the plurality of LEDs 28. In general, the control unit 18 receives a signal from the light sensor 26 and controls a supply of electrical power to the LEDs 28 dependent upon the signal.

In the present embodiment, the plurality of LEDs 28 are mounted on a circuit board 16 that is mounted within the protective housing 20, and the light sensor 26 is mounted adjacent the plurality of LEDs 28. In this embodiment, the circuit board 16 has two opposed major surfaces. Mounted within the housing 20, one of the two major surfaces of the circuit board 16 is adjacent the inner surface 24 of the housing 20. In this embodiment, the sensor 26 and the plurality of LEDs 28 are mounted to the other major surface of the circuit board 16. Those skilled in the art will appreciate that any standard circuit board(s) that are ordinarily used for mounting LEDs or other light sources can be used in the present invention, and such alternative constructions should be considered within the scope of the claimed invention. Furthermore, again, light sources other than LEDs and locations of the sensor other than on the circuit board adjacent the LEDs or other light source(s) are also possible without departing from the spirit and scope of the invention.

While one embodiment is described in detail herein, those skilled in the art will recognize that many alternative embodiments are also suitable for the present invention. Many different circuit board designs could be used, and it is also possible that the plurality of LEDs 28 or other such light sources and/or the light sensor 26 could be mounted in other manners. While I specify that the light sensor 26 and the plurality of LEDs 28 are adjacent each other, this should be construed broadly as well. For example, the sensor 26 and the plurality of LEDs 28 or other light sources could be independent components that are positioned separately within the housing 20, as long as they are directed towards a common target surface 122 (shown in FIG. 4), as described below. Alternative embodiments that can be devised by those skilled in the art, consistent with the teachings of this disclosure, should be considered within the scope of the claimed invention.

Figure 2:
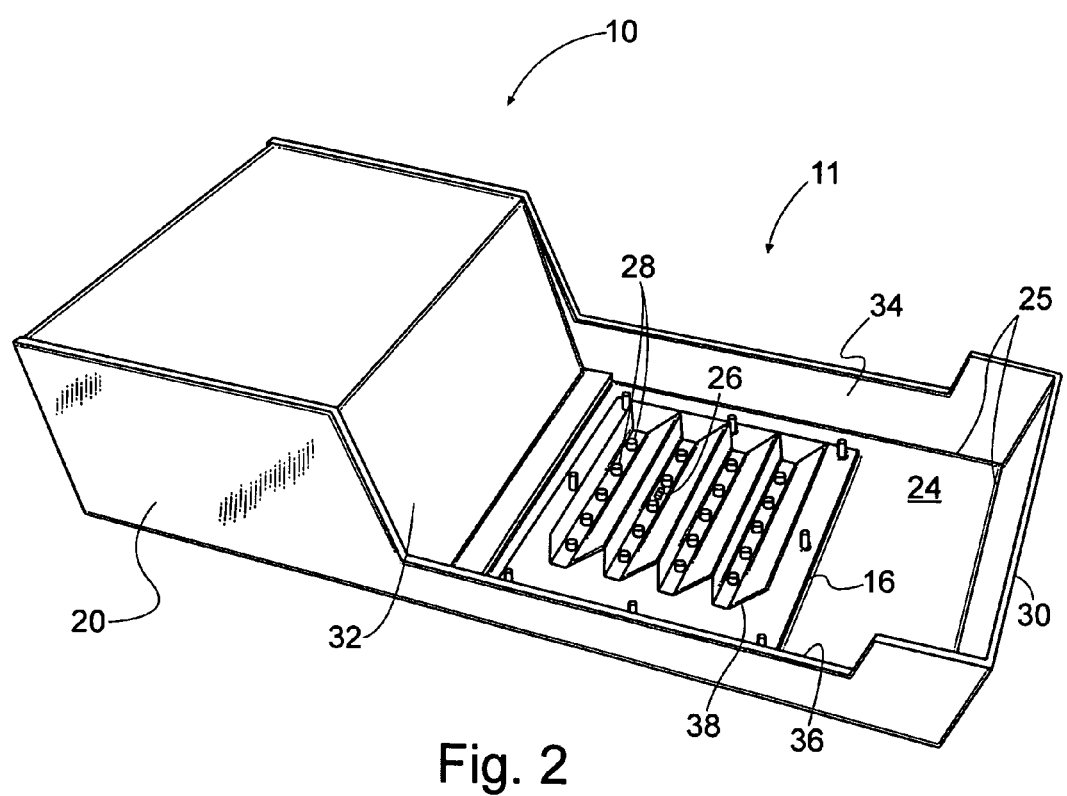
FIG. 2 is a perspective view of an underside portion of the lighting module of FIG. 1.

FIG. 2 is a perspective view of an underside portion of the lighting module 10 of FIG. 1. In the embodiment of FIG. 2 the circuit board 16 is mounted to the inner surface 24 of the housing 20 as described above. The housing 20 includes a downwardly extending sidewall that extends downwardly from the perimeter 25 of the inner surface 24 of the housing 20. In the present embodiment, the downwardly extending sidewall includes four sidewalls that surround the circuit board 16: a front sidewall 30, a rear sidewall 32, and two side sidewalls 34 and 36. When the lighting module 10 is oriented as shown in FIG. 1, the sidewalls 30, 32, 34, and 36 extend downwardly from the perimeter 25 of the inner surface 24 of the housing 20. Once more, those skilled in the art will appreciate that the structure of the circuit board 16 and the housing 20 is merely exemplary, such that numerous other configurations are possible without departing from the spirit and scope of the invention.

In the embodiment of FIG. 2, the LEDs 28 are arranged within a reflector assembly 38 that reflects a portion of the light emitted by the LEDs 28. The reflector assembly 38 is configured such that the light emitted by the LEDs 28 produces the desired illumination pattern on the target surface.

Figure 3:
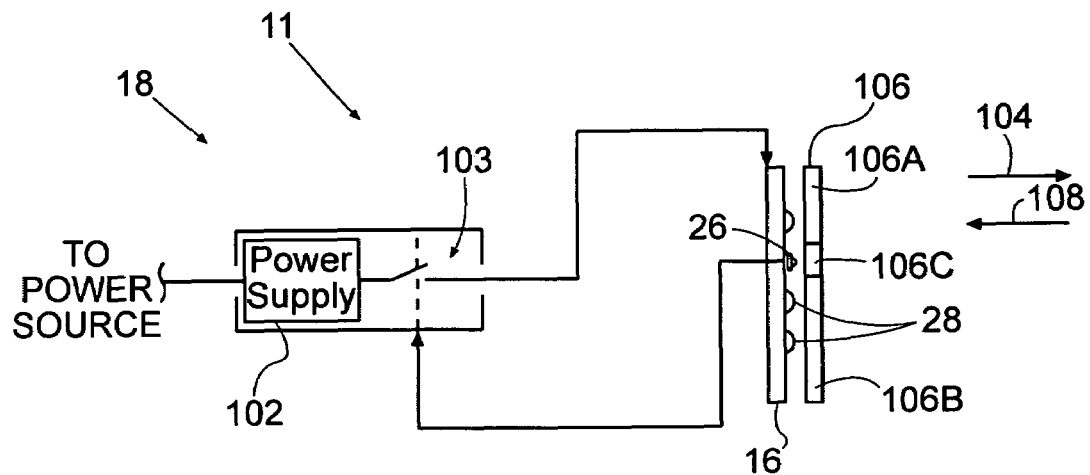
FIG. 3 is a diagram of one embodiment of the photosensor control unit of FIGS. 1 and 2.

FIG. 3 is a diagram of one embodiment of the lighting module 10 and the photosensor control unit 11. In this embodiment, the control unit 18 is coupled to the array of LEDs 28 and the light sensor 26. The control unit 18 includes a power supply 102 and a switch 103. The power supply 102 receives electrical power from a source of electrical power and produces conditioned electrical power for the LEDs 28. The control unit applies conditioned electrical power from the power supply 102 to the LEDs 28 via the switch 103. When the conditioned electrical power is applied to the LEDs 28, the LEDs 28 produce light having wavelengths within a first range of wavelengths, wherein the first range of wavelengths is within the visible light spectrum. The LEDs 28 are arranged to emit light substantially in a first direction 104.

LEDs are diodes that emit light when electrical current passes through them. LEDs are in general more efficient, last longer, operate at cooler temperatures, and are more durable than many other known types of light sources. Also, unlike many other known types of light sources, LEDs emit light within relatively narrow frequency ranges. Again, though, it will be appreciated by those skilled in the art that a variety of light sources other than LEDs, whether now known or later developed, may be employed without departing from the spirit and scope of the invention.

The conditioned electrical power produced by the power supply 102 includes an electrical voltage and current. In general, the power supply 102 controls the voltage and/or the current to meet electrical power requirements of the LEDs 28. For example, the LEDs 28 may require a substantially constant electrical current. In this situation, the power supply 102 may control the voltage of the conditioned electrical power such that current of the conditioned electrical power is substantially constant.

The visible light spectrum includes light having wavelengths between about 380 nanometers (nm) and approximately 740 nm. The LEDs 28 may include, for example, LEDs producing white, red, green, or blue light, or a combination thereof. In general, LEDs producing white light emit light having wavelengths between about 430 nm and approximately 660 n. LEDs producing red light emit light having wavelengths between about 630 nm and approximately 660 nm. LEDs producing green light emit light having wavelengths between about 520 nm and approximately 570 nm, and LEDs producing blue light emit light having wavelengths between about 430 nm and approximately 470 nm.

A lens 106 is positioned adjacent to the LEDs 28 in the direction 104. Portions 106A and 106B of the lens 106 are substantially transparent to the light emitted by the LEDs 28. The portions 106A and 106B distribute the light emitted by the LEDs 28 substantially in the first direction 104 to achieve the desired illumination pattern on the target surface. The lens may be flat or curved in any number of configurations for the purpose of focusing or diffusing the light emitted by the LEDs or other light source, so it is to be understood that the lens 106 as shown and described is merely exemplary and that the invention is not so limited.

The light sensor 26 may be positioned within the arranged LEDs 28 or in any other location on or about the lighting module 10 so as to generally orient the sensor 26 downwardly. The light sensor 26 is responsive to light having wavelengths within a second range of wavelengths, wherein the second range of wavelengths is not within the visible light spectrum. The second range of wavelengths may be, for example, within the near-infrared spectrum or the ultraviolet spectrum. The near-infrared light spectrum includes light having wavelengths between about 750 nm and approximately 1 millimeter, and the ultraviolet light spectrum includes light having wavelengths between about 10 mm and approximately 380 nm. The light sensor 26 may be, for example, a phototransistor responsive to light in the near-infrared light spectrum, or a photodiode responsive to light in the ultraviolet light spectrum. The light sensor 26 is oriented to receive light originating substantially from a second direction 108 and via a portion 106C of the lens 106. The second direction 108 is substantially opposite the first direction 104 in which the portions 106A and 106B of the lens 106 distribute the light emitted by the LEDs 28.

While I specify that the second direction 108 is substantially opposite the first direction 104, this should not be narrowly construed. The second direction 108 is intended to encompass a range of light from a target surface 122, as shown in FIG. 4.

The portion 106C of the lens 106 is substantially transparent to the light within the second range of wavelengths to which the light sensor 26 is responsive. The portion 106C of the lens 106 may function to optically focus the light sensor 26 to receive light from the second direction 108, as described in greater detail below. Those skilled in the art will again appreciate that the lens 106, or any portion thereof, may be flat or curved or of any other such configuration selected for a particular lighting application. Moreover, the lens may also be configured for wavelength filtering so that the various portions 106A, 106B, 106C actually control the range of wavelengths that can pass therethrough. It will be appreciated by those skilled in the art, however, that the invention is not so limited and that the lens 106 can take any such form, whether or not serving to focus or filter light passing in either direction 104, 108, without departing from the spirit and scope of the invention. That is, those skilled in the art will appreciate that the lens configuration will not ultimately dictate the structure and function of the photosensor control unit 11 by which a light source 28 emits light within a first range of wavelengths while the sensor 26 detects light within a second range of wavelengths so as to then control the operation of the light source.

The light sensor 26 produces a signal indicative of an amount of light within the second range of wavelengths received by the light sensor 26. The control unit 18 receives the signal from the light sensor 26 and provides the conditioned electrical power produced by the power supply 102 to the LEDs 28 dependent upon the signal. For example, the signal produced by the light sensor 26 may have a magnitude indicative of the amount of light within the second range of wavelengths received by the light sensor 26. The control unit 18 may provide the conditioned electrical power to the LEDs 28 when the magnitude of the signal is less than a threshold value, and may interrupt the supply of conditioned electrical power to the LEDs 28 when the magnitude of the signal is greater than or equal to the threshold value.

Figure 4:
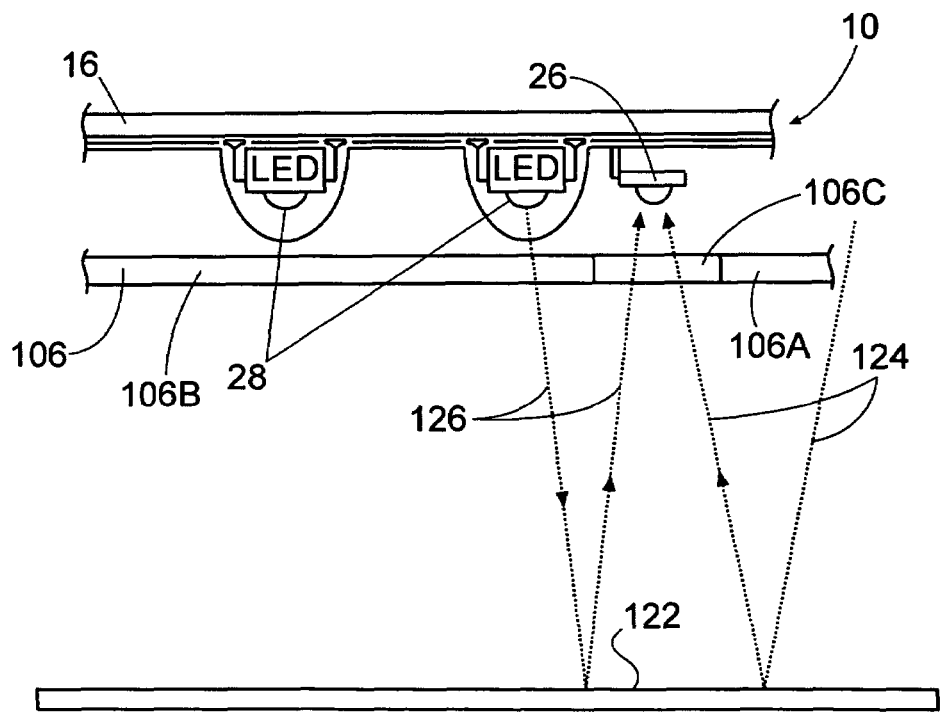
FIG. 4 is a side elevation view of a portion of the lighting module and the photosensor control unit of FIG. 3 wherein the lighting module is oriented to illuminate a target surface.

FIG. 4 is a side elevation view of the lighting module 10, illustrating how the lighting module 10 is oriented to illuminate a target surface 122. Light 126 produced by the LEDs 28 or other light source illuminates the target surface 122. The target surface 122 may be, for example, a portion of a street or a sidewalk.

Ambient light from the sun (i.e., daylight), represented by rays 124, is reflected from the target surface 122 and received by the light sensor 26 via the portion 106C of the lens 106. In the exemplary embodiment, the portion 106C of the lens 106 functions to optically focus the light sensor 26 to receive light from the second direction 108, from the target surface 122, though, once more, those skilled in the art will appreciate that the invention is not so limited.

In general, the ambient daylight includes the second range of wavelengths to which the sensor 26 is responsive. As a result, the control unit 18 of FIG. 3 may provide the conditioned electrical power to the LEDs 28 when a level of the ambient daylight is less than a threshold value, and may interrupt the supply of conditioned electrical power to the LEDs 28 when a level of the ambient daylight is greater than or equal to the threshold value.

A portion of the light produced by the LEDs 28, represented by rays 126, is also reflected from the target surface 122 and received by the portion 106C of the lens 106. The portion 106C of the lens 106 may, for example, partially or totally block the light within the first range of wavelengths produced by the LEDs 28. Alternately, or in addition, where the portion 106C does not filter light of any wavelength, the sensor 26 may respond to the first range of wavelengths produced by the LEDs 28 to a lesser extent than the second range of wavelengths. In any case, the signal produced by the light sensor 26 is preferably largely independent of any amount of light within the first range of wavelengths received by the light sensor 26 via the portion 106C of the lens 106.

Figure 5:
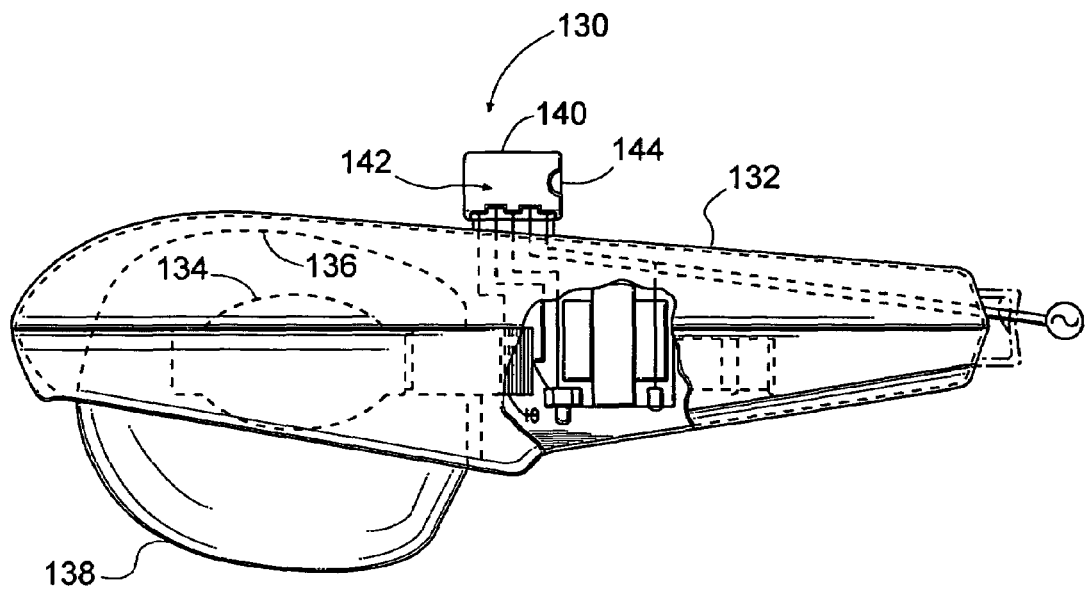
FIG. 5 is a side elevation view of a typical prior art street lighting fixture.

FIG. 5 is a side elevation view of a typical prior art street lighting fixture 130. (See U.S. Pat. No. 3,949,211 to Elms.) The prior art street lighting fixture 130 includes a fixture body 132 housing a light source 134. Light emitted by the light source 134 exits the fixture body 132 in a downward direction via a reflector 136 and a diffuser 138. A photocontrol 140 including a photocell is mounted in an opaque housing 142 on an upper surface of the fixture body 132. The opaque housing 142 has a plastic window 144 in a side surface that is substantially transparent to visible light. Ambient light entering the housing 142 via the plastic window 144 strikes the photocell of the photocontrol 140. In response to a signal from the photocell, the photocontrol 140 applies electrical power to the light source 134 during low ambient light conditions (e.g., after sunset) and interrupts the supply of electrical power during high ambient light conditions (e.g., during daylight hours).

As is typical, the photocell of the photocontrol 140 is sensitive to visible light and cannot distinguish between ambient light and the light emitted by the light source 134. In order to prevent the photocell from being influenced (e.g., triggered) by the light emitted by the light source 134, the plastic window 144 of the housing 142 is oriented (i.e., aimed) away from the light exiting the fixture housing 132 such that the photocell does not receive light emitted by the light source 134.

A problem arises in that, positioned on the upper surface of the fixture housing 132, the photocontrol 140 is exposed to several harmful conditions. First of all, the photocontrol 140 is subjected to direct sunlight all day long. Sunlight includes destructive ultraviolet radiation, and solar heating causes the components of the photocontrol 140 to be heated to temperatures in excess of 85 degrees Celsius. In addition, the upper surface mounting of the photocontrol 140 also subjects the photocontrol 140 to harsh weather, debris from trees, and bird droppings. The debris from trees and bird droppings can obscure the plastic window 144, shading the photocell of the photocontrol 140 from the ambient light and causing the luminaire to operate for longer hours. Further, a conventional photocell is typically mounted atop a fixture housing via a plug in connector fitting arrangement to facilitate replacement. This fitting arrangement can and often does leak during rainy weather, allowing rain water to enter the fixture housing and hasten electrical connection corrosion and failure. The above exposure conditions often eventually lead to failure or unpredictable performance of the photocontrol 140 and/or the prior art street lighting fixture 130.

Figure 6:
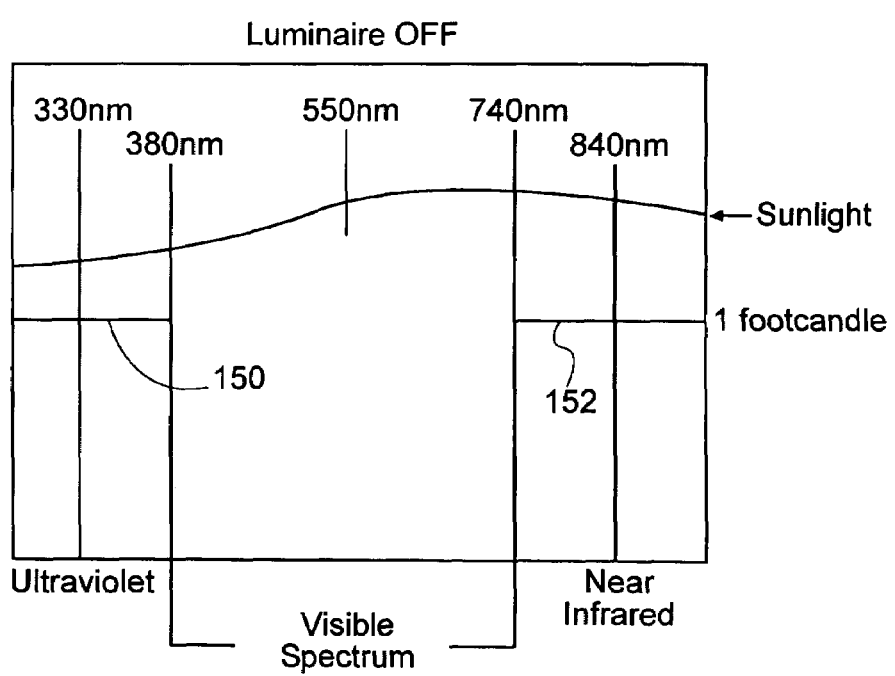
FIG. 6 is a graph of light intensity versus wavelength at the lighting module of FIGS. 1 and 2 during daylight hours.

FIG. 6 is a graph of light intensity versus wavelength at the lighting module 10 of FIGS. 1 and 2 during daylight hours. In general, the light sensor 26 may be responsive to light within the near-infrared spectrum and/or the ultraviolet spectrum. In FIG. 6 a first exemplary threshold level 150 is shown for the near-infrared spectrum and a second exemplary threshold level 152 is shown for the ultraviolet spectrum. For convenience, the exemplary threshold levels 150 and 152 are both representative of 1 foot candle.

In FIG. 6, the magnitude of the signal produced by the light sensor 26 in the ultraviolet case is greater than the threshold level 150. In response, the control unit 18 (FIGS. 1 and 3) may interrupt the supply of conditioned electrical power from the power supply 102 (FIG. 3) to the LEDs 28 (FIGS. 1-2) and in this situation the lighting module 10 of FIGS. 1 and 2 is off. Similarly, the magnitude of the signal produced by the light sensor 26 in the near-infrared case is greater than the threshold level 152. The control unit 18 may interrupt the supply of conditioned electrical power from the power supply 102 to the LEDs 28, and the lighting module 10 may again be off.

Figure 7:
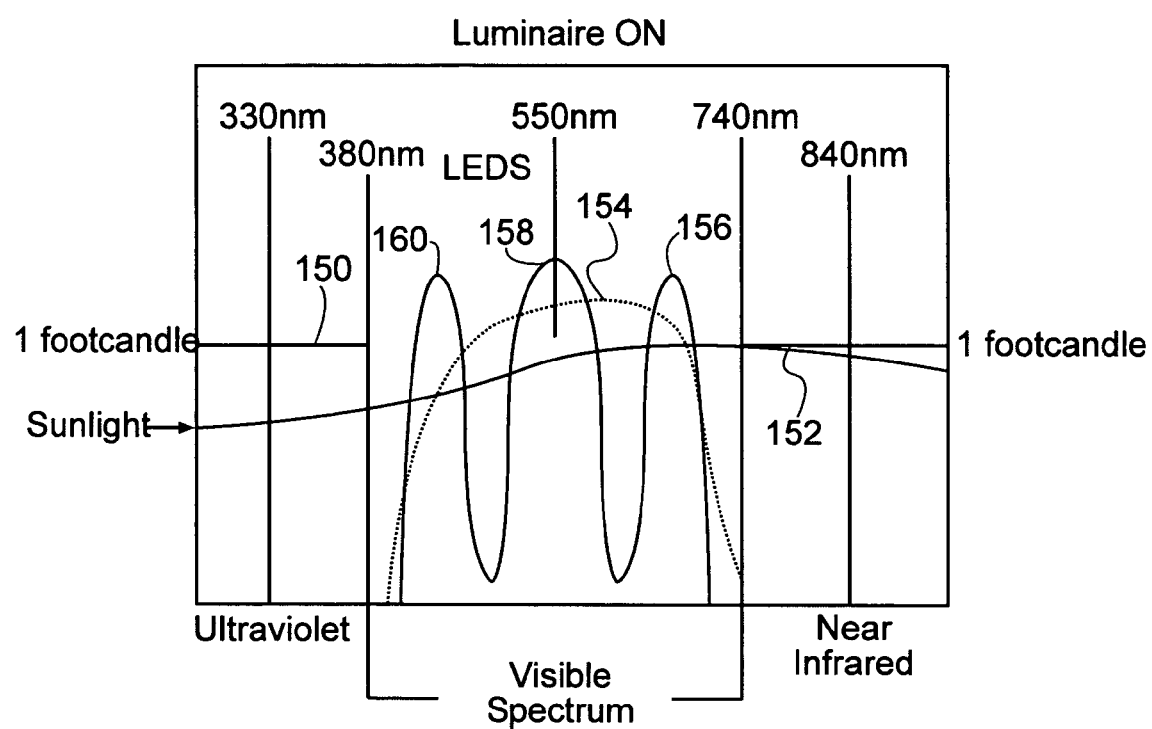
FIG. 7 is a graph of light intensity versus wavelength at the lighting module of FIGS. 1 and 2 at sunset.

FIG. 7 is a graph of light intensity versus wavelength at the lighting module 10 of FIGS. 1 and 2 at sunset. In FIG. 7, the magnitude of the signal produced by the light sensor 26 in the ultraviolet case is less than the threshold level 150. In response, the control unit 18 (FIGS. 1 and 3) may provide the conditioned electrical power from the power supply 102 (FIG. 5) to the LEDs 28 (FIGS. 1-2), and in this situation the lighting module 10 of FIGS. 1 and 2 is on. Similarly, the magnitude of the signal produced by the light sensor 26 in the near-infrared case is less than the threshold level 152. The control unit 18 may provide the conditioned electrical power from the power supply 102 to the LEDs 28, and the lighting module 10 may again be on.

As described above, the LEDs 28 (FIGS. 1-2) may include LEDs producing white, red, green, or blue light, or a combination thereof or may be some other light source now known or later developed. In FIG. 7 a curve 154 represents white light produced by some or all of the LEDs 28, a curve 156 represents red light produced by some or all of the LEDs 28, a curve 158 represents green light produced by some or all of the LEDs 28, and a curve 160 represents blue light produced by some or all of the LEDs 28. It is noted that in all cases the light produced by the LEDs 28 is within the visible light spectrum.

While the invention has been described with reference to at least one preferred embodiment, it is to be clearly understood by those skilled in the art that the invention is not limited thereto. Rather, the scope of the invention is to be interpreted only in conjunction with the appended claims.

What is claimed is:

1. A photosensor control unit for use in a lighting module producing and directing light within a first range of wavelengths substantially downwardly toward a substantially horizontal target surface, a housing of the lighting module having a substantially downwardly-facing inner surface, the photosensor control unit comprising:
    a circuit board having a plurality of LEDs, the circuit board being mounted adjacent the inner surface of the housing of the lighting module such that the LEDs are substantially downwardly-directed, the LEDs being configured to produce light within the first range of wavelengths;
    a light sensor mounted on the circuit board adjacent the LEDs such that the light sensor is oriented in a substantially downwardly-facing direction toward the target surface, the light sensor being responsive to light having wavelengths within a second range of wavelengths, wherein the second range of wavelengths is exclusive of the first range of wavelengths;
    a switch electrically connected to the lighting module and the light sensor, the switch adapted to operably control the lighting module responsive to the light sensor; and
    a lens installed in the housing substantially parallel to and offset from the circuit board on which the LEDs and the light sensor are mounted, wherein the lens comprises:
    an intermediate first portion of the lens that is substantially transparent to the light within the second range of wavelengths to which the light sensor is responsive, the first portion being positioned substantially adjacent to the light sensor, whereby the first portion of the lens functions to optically focus the light sensor to receive light within the second range of wavelengths reflected from the target surface and traveling substantially upwardly in a second direction; and
    at least one second portion of the lens about the first portion, the at least one second portion being positioned substantially adjacent to the LEDs and being substantially transparent to the light emitted by the LEDs within the first range of wavelengths, whereby the at least one second portion of the lens distributes the light emitted by the LEDs substantially downwardly toward the target surface,
    whereby the lighting module emits light via the LEDs having wavelengths within the first range of wavelengths responsive to the absence of light within the second range of wavelengths detected by the light sensor.

2. The photosensor control unit of claim 1 wherein the first portion blocks the light within the first range of wavelengths emitted by the at least one LED.

* * * * *